United States Patent [19]

Roberts

[11] Patent Number: 4,973,876
[45] Date of Patent: Nov. 27, 1990

[54] ULTRASONIC POWER SUPPLY

[75] Inventor: Allan J. Roberts, Poughquag, N.Y.

[73] Assignee: Branson Ultrasonics Corporation, Danbury, Conn.

[21] Appl. No.: 409,772

[22] Filed: Sep. 20, 1989

[51] Int. Cl.$^5$ .......................................... H01L 41/08
[52] U.S. Cl. .................................... 310/316; 318/116
[58] Field of Search ............... 310/316, 317; 318/116, 318/118

[56] References Cited

U.S. PATENT DOCUMENTS

| 4,256,987 | 3/1981 | Takeuchi et al. | 310/316 |
| 4,275,363 | 6/1981 | Mishiro et al. | 310/316 X |
| 4,277,710 | 7/1981 | Harwood et al. | 310/316 |
| 4,587,958 | 5/1986 | Noguchi et al. | 310/316 X |

Primary Examiner—Mark O. Budd
Attorney, Agent, or Firm—Polster, Polster and Lucchesi

[57] ABSTRACT

An ultrasonic power supply for driving a piezoelectric transducer at its parallel resonant frequency includes a clamped-mode resonant converter for converting direct current to alternating current and a demodulator, a loop filter and a voltage controlled oscillator in a phase locked loop configuration. The power supply also includes a control circuit for adjustably setting and controlling the amplitude of vibration of the transducer, and providing during start-up a ramp start. The power supply, further, includes a control circuit for limiting the maximum permissible current flow to the transducer and the reverse current flow from the transducer resulting from stored mechanical energy. Both control circuits provide feedback signals which control the pulse width modulated operation of the clamped-mode resonant converter and thereby control the voltage amplitude of the alternating current output from the converter. The phase locked loop circuit causes the frequency of the alternating current output from the converter to track the parallel resonant frequency of the transducer.

25 Claims, 5 Drawing Sheets

ULTRASONIC POWER SUPPLY

BACKGROUND OF THE INVENTION

This invention concerns an electronic power supply for driving an electroacoustic transducer at its resonant ultrasonic frequency, typically a predetermined frequency in the range between 18 kHz and 60 kHz. More specifically, this invention refers to a power supply for driving a piezoelectric transducer provided with a horn at its parallel resonant frequency, such transducer and horn combination being used most frequently for welding thermoplastic parts, requiring power from several hundred watts to several kilowatts for time intervals ranging from several milliseconds to a few seconds. A typical prior art power supply of this type is shown in U.S. Pat. No. 3,432,691 issued to A. Shoh, dated Mar. 11, 1969, entitled "Oscillatory Circuit for Electroacoustic Converter". The power supply disclosed hereafter incorporates improvements and novel features not present in the prior art supply, such features being necessitated by the requirement that ultrasonic welding apparatus be operable by computer control at high speed and under conditions of high precision and repeatability involving varying workpieces and production runs.

SUMMARY OF FEATURES OF THE INVENTION

The present invention discloses a power supply for driving a piezoelectric transducer provided with a horn at its parallel resonant frequency, typically 20 kHz, wherein the amplitude of mechanical vibrations manifest at the output surface of the horn can be adjusted and retained constant at the adjusted value, wherein the starting sequence, that is bringing the transducer with horn from standing still to its full vibrational amplitude, is effected in a fast and stepless manner, wherein the resonant frequency of the transducer and horn combination is tracked and used as a control signal to adjust the frequency of the power supply, wherein the flow of current to and from the transducer is limited to preset values, and, finally, including means for accomodating higher rates of operation (weld cycles) than has been possible with the prior art devices.

The following description will provide an overview of the novel features indicated above.

AMPLITUDE ADJUSTMENT

Ultrasonic transducers for power applications normally are operated in their parallel resonant mode. By the use of a compensation inductor, the power supply will act as a voltage source. With suitable tuning, the amplitude of mechanical vibration manifest at the transducer output surface is then proportional to the drive voltage (motional voltage) and the value of the current is proportional to the power demanded by the workpiece. In this manner, the amplitude of vibration can more easily be regulated or adjusted despite wide variations in power requirements.

Most known power supply designs utilize a two part circuit to accomplish vibration amplitude adjustment. (This is apart from the use of mechanical booster horns or horns of different mechanical gain coupled to the transducer assembly for amplitude adjustment). The major component of the power supply is a converter circuit employing electrical switching devices for converting direct current voltage to an alternating current voltage whose frequency is dictated by the mechanical resonance of the ultrasonic transducer. The amplitude of the alternating current voltage is governed by the value of the direct current voltage supplied to the switching devices and hence, the amplitude of the vibration is a function of the direct current voltage amplitude. For changing the amplitude of vibration, the value of the direct current voltage must be changed. The direct current voltage is derived by rectifying and filtering the alternating current line voltage. To make the alternating current voltage variable, either a variable autotransformer or a switching regulator has been used. This technique is inefficient and expensive as the power is processed twice and usually the response to a change in amplitude adjustment is slow.

In contrast, the power supply disclosed hereafter uses a direct current power source furnishing a constant amplitude voltage and a converter operating in a pulse width modulation mode for providing an alternating current voltage of suitable frequency for driving the transducer. The alternating current line voltage is rectified, filtered, and retained at a fixed value. The converter then generates the operating frequency voltage. The operating voltage is electronically controlled using the same switching devices of the converter. The result is a low cost, light weight and very fast response circuit. The circuit allows the amplitude of vibration to be adjusted during the weld process rather than being fixed at a preset value.

MECHANICAL AMPLITUDE REGULATION

By using pulse width modulation in the direct current to alternating current converter, the amplitude of vibration of the transducer and horn can easily be electronically controlled. A compensation derived feedback circuit is used also in the output network of the power supply. This circuit provides a signal which is commensurate with the motional voltage or motional amplitude manifest at the transducer output surface. The signal is electronically processed and fed back to the pulse width modulation circuit. This technique allows the vibrational amplitude to be regulated with respect to line voltage variations and load variations. Hence, a control voltage signal can be used to set or vary the vibrational amplitude of the transducer with little or no influence from line voltage or load fluctuations. The fast response allows in-process control of the amplitude of vibrations.

STARTING SEQUENCE

The pulse width modulation technique described above is used also to start the ultrasonic transducer vibrations from rest. A ramp voltage is used to increase the motional voltage in a linear manner from zero to a regulated value. This is an improvement over the step-start method used previously as shown in U.S. Pat. No. 3,469,211 dated Sept. 23, 1969, issued to A. Shoh et al, entitled "Oscillatory Circuit for Electro-Acoustic Converter with Starting Means". The control is continuous, linear and is self adapting.

Different transducer assemblies require differing time periods to attain a set amplitude of vibration because of inertia and stored mechanical energy. In the present arrangement, a circuit is used to monitor the available current which the power supply can deliver during the start-up cycle. This signal is also fed back to the pulse width modulation circuit and is used to modify the ramp signal. With this technique, the power supply will self-adjust the output power provided to the transducer and bring the transducer to the set vibrational amplitude in the shortest practical time.

FREQUENCY TRACKING

The natural operating frequency (resonance) of an ultrasonic transducer will vary somewhat with the operating conditions. Among these conditions are mechanical wear of the horn assembly, temperature and mechanical loading. Also, there is an inherent variance between individual transducer assemblies. In the present invention, a phase-locked loop circuit is used for sensing the fundamental frequency current and voltage phase relationship in the power circuit and the operating frequency is adjusted as a function of the resonant frequency of the transducer at which frequency the phase shift is zero. This arrangement results in the maximum forward power transfer and operating efficiency with the least amount of stress manifest on the switching components. This circuit is active during the entire weld cycle, both during start-up and during the power transfer interval.

RATE OF OPERATION

Most prior art power supplies operate on a pulsed time basis. That is, the power supply and transducer intially are at rest. A weld command starts the power supply, causing it to deliver power to the transducer and a workpiece in contact therewith for a period of time, and thereafter the power supply and transducer return to the rest condition. The rate at which this sequence can occur is limited by several factors, one of which is the power dissipated by the system, and another one is the reaction time of the circuits and of the transducer assembly. Currently available power supplies are limited to about one hundred operations per minute. The power dissipated in the start-up sequence becomes a limiting factor as well as the time response of the control circuit.

By the use of a ramp start and a switch mode control of the power circuit, power dissipation is kept to a minimum. The aforementioned control circuit is designed to operate at a faster rate and the direct current to alternating current converter using pulse width modulation provides for much better control of the forward and reverse power to the transducer, reverse power being the power generated by the transducer as a result of stored mechanical energy when the power to the transducer is rapidly decreased. As a result, a power supply, in accordance with the improvements indicated hereinabove, can operate at two hundred operations per minute, an important improvement needed for high speed, computer controlled production runs. Other and still further important features of the present invention will become more clearly apparent from the following specification when read in conjunction with the accompanying drawings.

DETAILED DESCRIPTION

Figure 1:
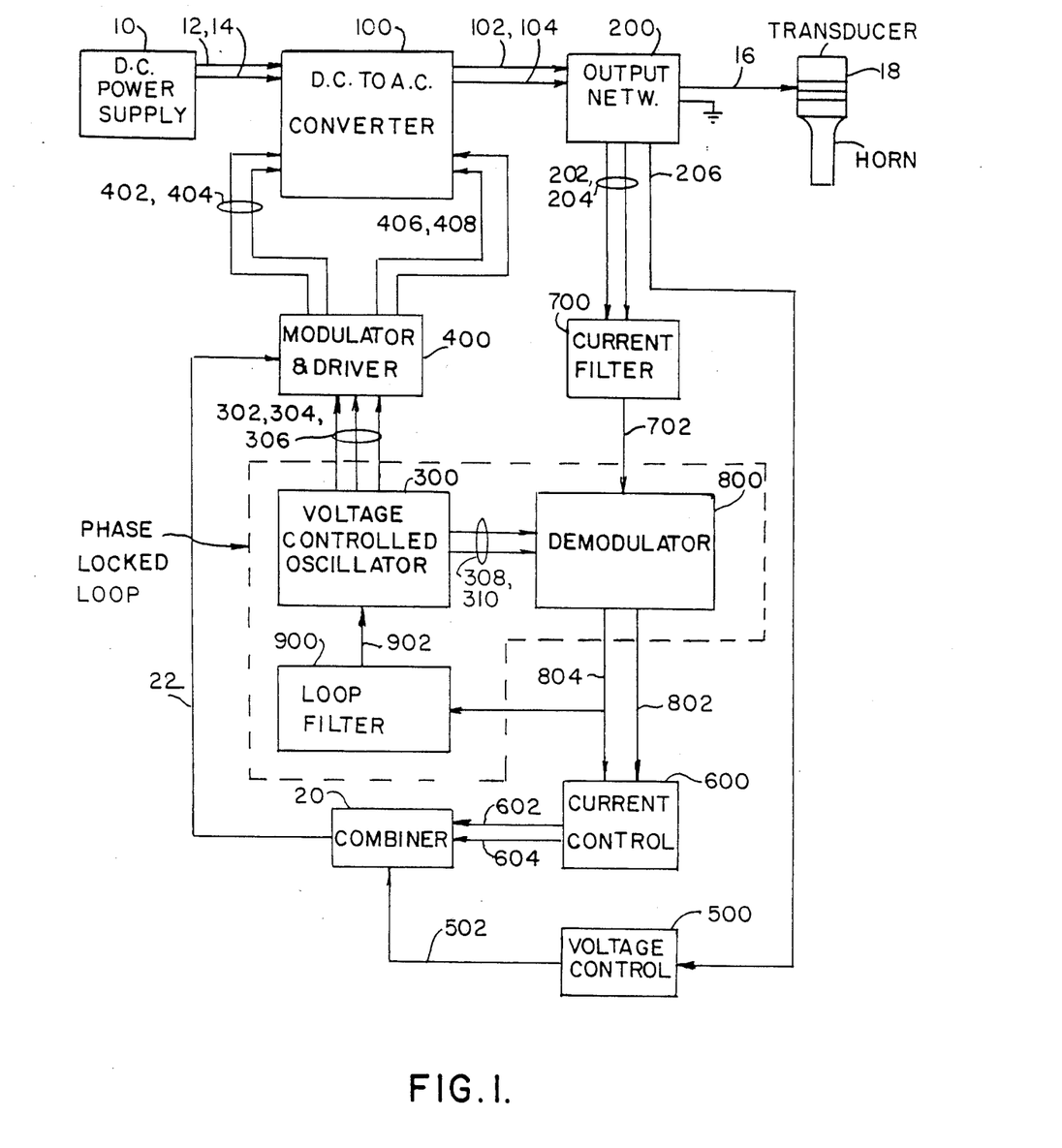
FIG. 1 is a schematic block diagram of the new and improved power supply forming the invention.

Referring now to the figures and FIG. 1 in particular, a simplified block diagram is shown for explaining, in a general manner, the architecture of the new and improved ultrasonic power supply. A direct current power supply, numeral 10, using conventional means, provides rectified and filtered direct current power via conductors 12 and 14 to a direct current to altenating current converter unit 100. The converter unit 100 comprises semiconductor switches for converting the direct current voltage from the power supply 10 to an ultrasonic frequency, typically 20 kHz, a common frequency used for operating high power ultrasonic welding apparatus. The switching devices in the converter unit 100 are operated in a switch mode manner (non-linear) to provide both the frequency generation (20 kHz) and control of the output voltage using a pulse width modulation technique.

The output network 200 via conductors 102 and 104 receives the ultrasonic frequency output voltage from the converter unit 100 and provides via conductor 16 the driving voltage and current to the ultrasonic transducer assembly 18. The output network 200 transforms and matches the output impedance of the converter unit to the impedance of the transducer assembly. The output network 200 comprises electrical components forming a resonant circuit in conjunction with the transducer assembly 18. The output network also provides input signals to certain control circuits.

The transducer assembly 18 comprises a stack of piezoelectric discs clamped between metal masses, and a horn coupled thereto for coupling the vibrations produced by the piezoelectric discs, responsive to applied electrical energy, to a workpiece to be welded. The transducer assembly is of conventional construction and is well known in the art.

The voltage controlled oscillator 300 is the main frequency and timing generator for the entire power supply and its control circuits. It comprises a voltage controlled oscillator which operates at a harmonic frequency of the fundamental ultrasonic frequency, 20 kHz in the present embodiment, and a digital frequency divider to derive system reference signals.

A modulator and driver circuit 400 receives three input signals from the voltage controlled oscillator 300, designated by numerals 302, 304 and 306 corresponding to two times the fundamental frequency ($2f_p$), two times the fundamental frequency 180 degrees phase shifted ($2f_p$), and the fundamental frequency ($f_p$). The modulator and driver circuit includes linear and digital circuits for generating signals along conductors 402, 404, 406 and 408 for controlling the operation of the direct current to alternating current converter 100. A bi-phase signal is generated by the modulator which provides for the pulse width modulation of the converter unit 100.

The frequency of operation is responsive to the input from the voltage controlled oscillator 300 and is controlled in time by an analog input signal from the voltage control circuit 500 and the current control circuit 600. The output signals from the modulator are amplified by drive stages and then used for controlling the switching devices of the converter unit 100.

The current filter circuit 700 is an electronic filter used for obtaining the fundamental current signal ($f_p$). An input signal responsive to the operating current is derived from the output network 200 via conductors 202 and 204. The input signal contains the fundamental current frequency ($f_p$) and the odd harmonics of the fundamental frequency. The filter is unique in that it is a bandpass filter for a range of frequencies around the fundamental frequency, but attenuates the harmonic frequencies. At the same time, the filter is substantially phase transparent for the fundamental frequency within the bandpass range, that is, substantially no phase distortion occurs for the signal passing through the filter.

The current demodulator 800 is a synchronous type analog switch or ring demodulator. The filtered signal from the current filter 700 along conductor 702 is chopped by digital reference signals from the voltage controlled oscillator 300, conductors 308, 310. The resultant output signals are proportional to the real and the imaginary components contained in the original current signal. These signals convey information as to the value of and the phase relation of the current components relative to the fundamental frequency drive voltage. The real component signal is applied as an input signal, conductor 802, to the current control circuit 600, while the imaginary or reactive component signal, conductor 804, is applied as input signal to the current control circuit 600 and to a loop filter circuit 900.

The loop filter 900 is a low pass type filter. The reactive current signal from conductor 804 is fed to the input of the loop filter. The output signal from the filter, conductor 902, is used as the phase related control or feedback voltage for the voltage controlled oscillator 300 for adjusting its frequency. In this manner, a phase locked loop is created which tends to keep the voltage and current in phase with each other at the switches of the direct current to alternating current converter 100. This is accomplished by seeking the frequency for which the reactive current is at a minimum. Maximum power transfer occurs when minimum stress is applied to the switching devices of the converter unit 100. The filter is an integral part of the phase locked loop. Its parameters dictate the overall rate of frequency compensation and control the stability of the loop.

The combination of circuits, that is a voltage controlled oscillator 300, demodulator 800 and loop filter 900, forming what is known as a phase locked loop (PLL) has been disclosed broadly in the art heretofore, see for instance patent publication DE 2,726,249, published Dec. 14, 1978, assigned to Otto Siebeck GmbH, or U.S. Pat. No. 4,642,581, dated Feb. 10, 1987, issued to J.J. Erickson, entitled "Ultrasonic Transducer Drive Circuit".

The voltage control circuit 500 is used to regulate the overall motional voltage supplied to the transducer 18. A signal corresponding to the motional voltage is derived in the output network 200. This motional voltage signal is applied to the voltage control circuit 500 via conductor 206, amplified, and compared with a control voltage. The result of this comparison is the input signal to the modulator and driver circuit 400 via combiner 20, conductors 502 and 22. In this manner, the conduction angle of the switching devices in the converter circuit 100 is controlled for maintaining a constant motional voltage to the converter.

During the start cycle, a ramp voltage is generated in the voltage control circuit 500 so as to increase the output amplitude of the signal to the modulator and driver unit 400 at a controlled linear rate from zero to a maximum limit dictated by a voltage control setting for causing the direct current voltage from the converter unit 100 to increase also from zero to a maximum.

The current control circuit 600 is used for regulating the maximum amount of current which the power supply delivers during the start and the run cycles. Both the reactive and the real current components are received as input signals from conductors 802 and 804, and combined in a manner to protect the power supply in various modes of operation. The circuit includes a set of differential amplifiers for limiting respectively the forward current and the reverse current to predetermined values. The output signals, conductors 602 and 604, also are supplied as a feedback signal to the modulator and driver circuit 400 via the combiner 20 for controlling the conduction angle of the switching devices in the converter 100 and, hence, to control the motional voltage to the transducer. During the start-up cycle, the circuit may modify the start ramp voltage signal as a function of the transducer characteristics.

Having described now the circuits in broad terms, the following description will more closely discuss the individual circuits.

Figure 2:
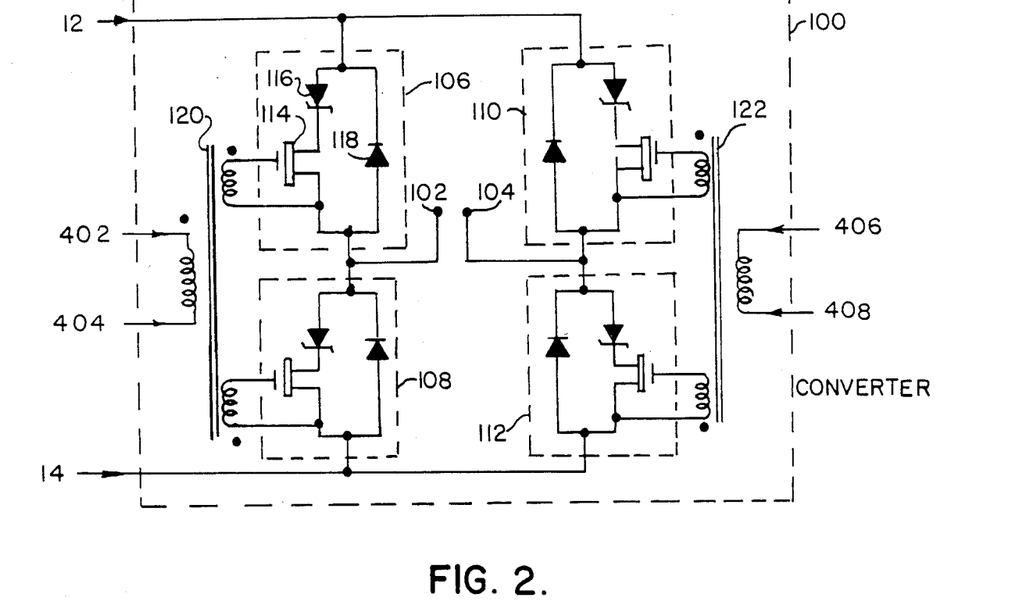
FIG. 2 is a schematic electrical circuit diagram of the d-c to a-c converter.

FIG. 2 is a schematic circuit diagram of the direct current to alternating current converter. It comprises essentially a full wave bridge rectifier and gate driving networks for controlling the operation of the respective rectifier switches. The circuit comprises four semiconductor switching devices 106, 108, 110 and 112, each including a power MOSFET device 114 for switching the power and a Schottky diode 116 connected in series with the drain lead for preventing the body diode in the device 114 from conducting current in the reverse direction. A high speed diode 118 is coupled across the series connection of the MOSFET device 114 and diode 116 to conduct reverse current appearing at the switching device.

The switching devices are driven by respective drive stages 120, 122 responsive to the output signals from the modulator and driver circuit 400. The resulting alternating current output appears at conductors 102 and 104. The switching circuit essentially is a modulator wherein the output voltage is a function of the pulse width modulation. At any time, two switches will be conductive and two switches will be non-conductive. A circuit of this configuration termed "Clamped-Mode Resonant Converter" is described in detail in the article entitled "Constant-Frequency Clamped-Mode Resonant Converters" by F. Tsai et al, IEEE Transactions on Power Electronics, volume 3, number 4, Oct. 1988, pp. 460–473, FIG. 2, p. 462.

As seen, the switches are separated into two half bridge circuits and each half bridge circuit shares a common gate drive network 120, 122. Each gate drive network includes circuit components for electrically isolating each switch and to provide proper level generation and waveform timing to prevent cross-conduction during transitions. The waveforms are generated by the modulator and driver circuit 400.

The advantage of this converter circuit resides in the fact that amplitude changes of the output voltage can be made rapidly without disturbing the phase relations existing in the phase locked loop which is used to control the frequency of operation of the converter circuit and, hence, the frequency of the alternating current output. Also, the circuit enables the resonant load to be driven at a much greater efficiency. Still further, power can be controlled in both directions, to and from the load. Finally, energy management is good in that power delivered to the output network and transducer during an ON period is continuous.

Figure 3:
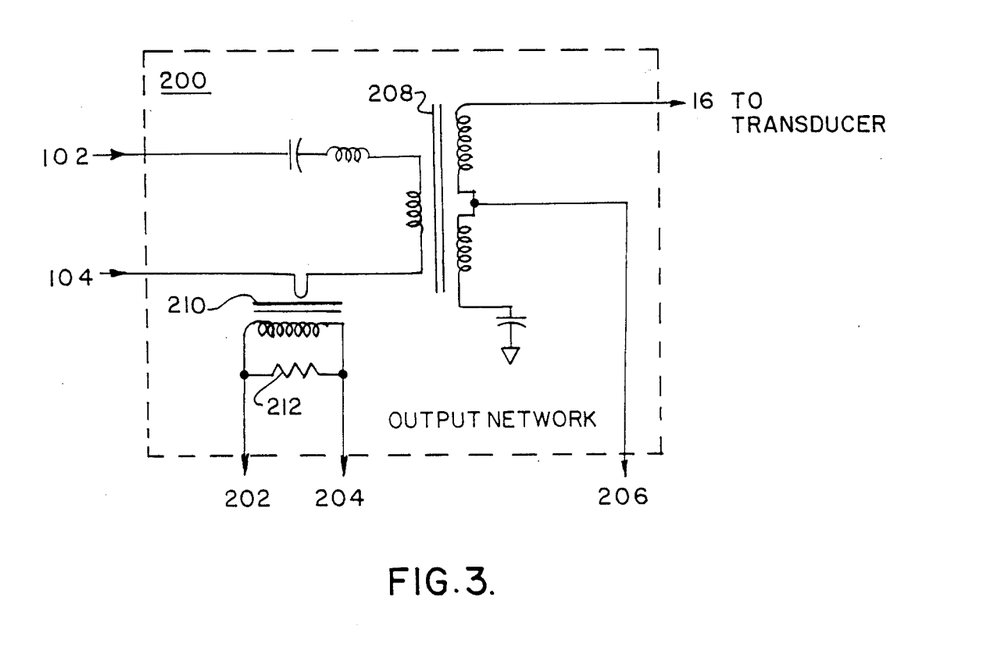
FIG. 3 is a simplified schematic electrical circuit diagram of the output network.

FIG. 3 is a simplified schematic circuit diagram of the output network. Since output networks, also known as impedance matching networks, are well known and have been used heretofore, the circuit will be described only briefly. The network 200 receives via conductors 102, 104 the alternating current for driving the transducer 18. The output transformer 208 matches the voltage and current levels between the converter circuit 100 and the transducer assembly 18. The components in series with the primary winding of the transformer are selected to cause the primary side together with the secondary side to which the transducer 18 is connected to be electrically resonant at the parallel resonant frequency of the transducer. A current transformer 210 coupled to the primary side of the network provides across resistor 212 a signal commensurate with the current flowing to the transducer. This signal is both linear and substantially phase transparent with the current in the primary side and this signal, evident as a voltage across conductors 202 and 204, in turn, is used to control the current supplied to the transducer 18 and for frequency tuning.

From the secondary winding of transformer 208 an output signal is developed, conductor 206, which signal is commensurate with the motional voltage driving the transducer 18, i.e. the voltage proportional to the amplitude of vibration. This voltage is fed to the voltage control circuit 500 and used, in turn, for regulating the motional output amplitude of the transducer 18.

Figure 4:
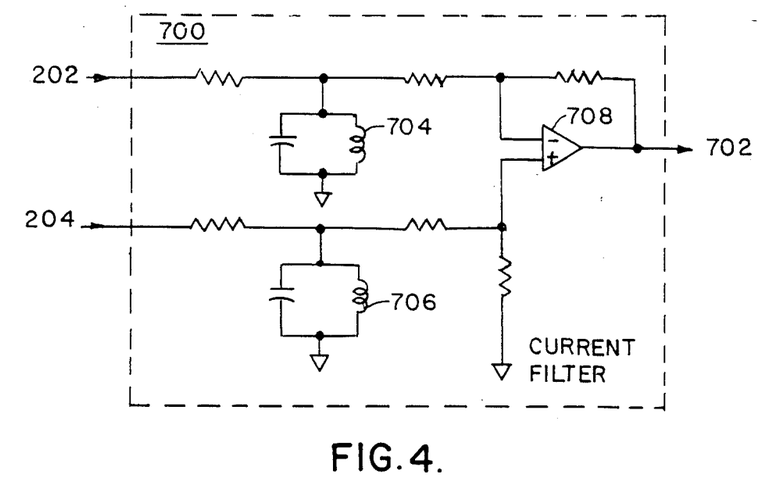
FIG. 4 is a simplified schematic electrical circuit diagram of the current filter.

FIG. 4 is a simplified schematic circuit diagram of the current filter 700. The filter is an electrical bandpass filter which will attentuate frequencies falling outside the band frequencies, but which will pass signals within the selected frequency band. One special feature of the filter resides in the characteristic that for the frequency range within the pass band, the phase shift of a signal from input to output will be minimal, i.e. the filter is phase transparent.

The pulsating output voltage from the direct current to alternating current converter is naturally filtered by the output network 200 and transducer 18. The output signal contains various frequency components, namely the fundamental frequency (20 kHz) and odd harmonics of the fundamental frequency. This gives rise to similar and related current signals. Of prime interest is the fundamental frequency current signal. At resonance, the fundamental frequency current and voltage will be in phase with one another. Hence, the first object of the filter is to pass the fundamental frequency current signal but to attenuate the harmonic signals.

The current signal commensurate with the current flow between the network 200 and transducer 18 is supplied via conductors 202, 204 to the current filter circuit 700. The circuit, see FIG. 4, comprises two stagger tuned parallel resonant circuits. The operating frequency and Q (quality factor) of each tank circuit 704, 706 is selected to have equal and opposite phase slope within the frequency band of interest. For instance, for a fundamental frequency of 20 kHz, tank circuit 704 may be tuned for 19 kHz and circuit 706 for 21 kHz, providing a pass range and phase transparency for the fundmental frequency of 20 kHz. The signals from the tank circuits are then summed in a summing circuit 708 to provide an output signal along conductor 702 containing only information with regard to the fundamental frequency as harmonic frequencies above or below the selected band width were attenuated by the resonant tank circuits. The signal along conductor 702, therefore, represents a signal corresponding to the amplitude and phase of the fundamental frequency of the current flowing between the converter 100 and the transducer 18.

Figure 5:
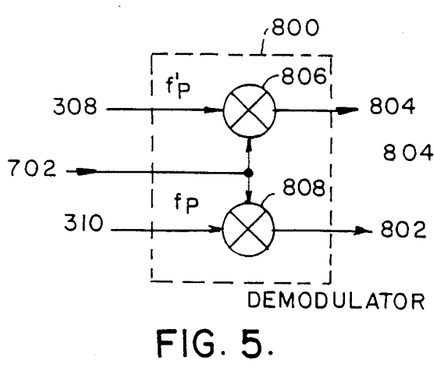
FIG. 5 is a schematic electrical circuit diagram of the demodulator.

FIG. 5 is a schematic circuit diagram of the demodulator 800. In order to maintain the transducer 18 at its resonant operating point, the current and voltage output from the converter 100 must be in phase. The current signal, filtered in circuit 700, is applied via conductor 702 to the demodulator 800 to obtain both the magnitude and phase information of the input signal.

The demodulator comprises a set of synchronous type analog switches. The analog output signal 702 from the filter 700 is applied to both analog switches 806 and 808, which are commercially available integrated circuit devices. Switch 806 also receives a digital signal $f'_p$ via conductor 308 commensurate with the fundamental operating frequency, but phase shifted by ninety degrees. Similarly, switch 808 receives a digital signal $f_p$ via conductor 310 commensurate with the fundamental operating frequency, but without phase shift. Therefore, the signal provided by conductor 804 will represent the imaginary or reactive current component flowing to the transducer 18, while the signal provided by conductor 802 will be commensurate with the real component value of such current. With no imaginary current component present in the current flowing to the transducer 18, the output signal of conductor 804 will be zero. If an imaginary component is present, the output signal along conductor 804 will be a plus or minus voltage signal.

Figure 6:
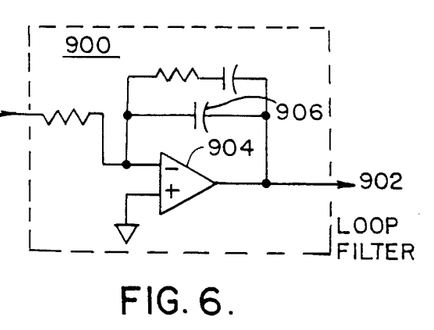
FIG. 6 is a schematic electrical circuit diagram of the loop filter.

FIG. 6 is a schematic electrical circuit diagram of the loop filter. The filter essentially is a low pass filter and is used to process the imaginary current component signal from the demodulator 800. The harmonic frequency content is blocked and an average direct current error voltage is obtained and sent as a correction (control) signal to the voltage controlled oscillator input for adjusting the frequency of the oscillator. The filter comprises an integrating circuit 904 which receives the output signal, via conductor 804, from the demodulator as described above.

The integrator 904 has controlled time constants which govern the overall response of the phase locked loop and which are selected for stability and rate considerations. A phase and current shift will cause the integrating circuit capacitor 906 to charge or discharge. The resultant voltage will cause the voltage controlled oscillator frequency to change in a manner to cause a reduction in phase shift. The voltage at the integrator output, conductor 902, will settle and become stable when the phase shift approaches zero (tuned condition). Changes in phase shift will cause a change in output signal which is fed to the oscillator to cause a corresponding frequency correction. The output voltage from the loop filter, therefore, is a voltage signal representative of the phase relation between the current and the voltage applied to the transducer 18 and such voltage signal will be a constant direct current voltage when a substantially zero phase shift condition prevails, that is, the voltage controlled oscillator provides the proper frequency for precise parallel resonant operation of the transducer.

Figure 7:
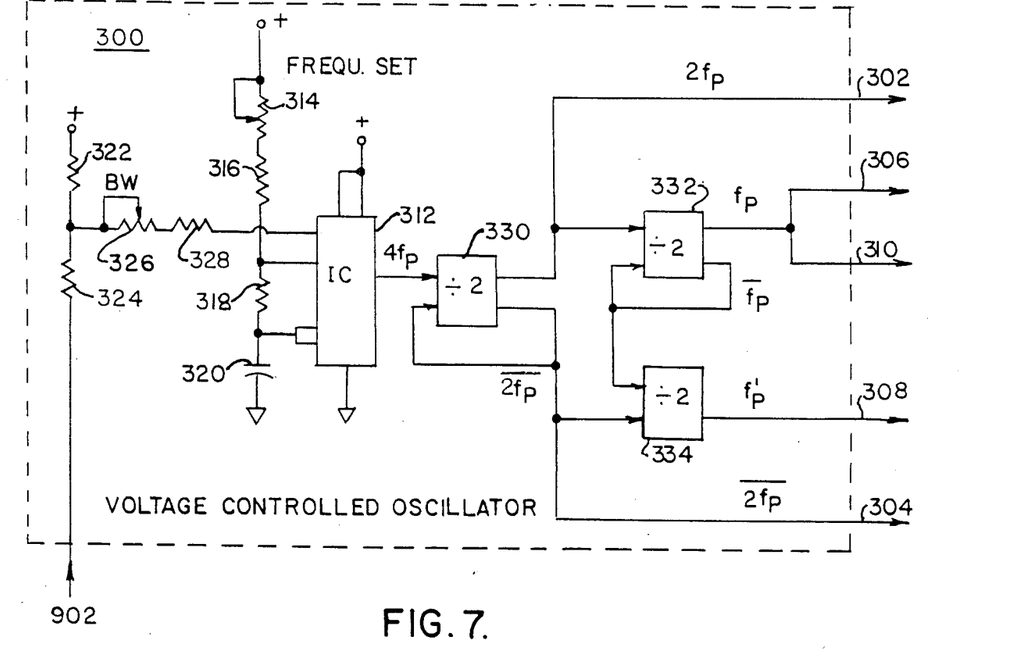
FIG. 7 is a schematic electrical circuit diagram of the voltage controlled oscillator.

FIG. 7 is a shcematic electrical circuit diagram of the voltage controlled oscillator. A specific circuit is shown, but other arrangements could be used for providing the same function. The oscillator includes a commercial oscillatory timer circuit 312, such as Texas Instruments No. 555, arranged to operate in an astable mode. The components 314, 316, 318 and 320 are selected to cause the oscillator to operate at a frequency of four times the parallel resonant frequency $4f_p$ of the transducer. The frequency of operation of the timer 312 is also a function of the value of the direct current voltage signal supplied to its input control by conductor 902, the signal from the loop filter. Resistors 322, 324, 326 and 328 form a voltage shifting and scaling network which couples the control or feedback voltage input to the control signal pin on timer 312. As the voltage at the input pin of timer 312 is made more positive, the frequency of the timer decreases and, conversely, a more negative control voltage will cause the frequency to increase.

Variable resistor 326 is used to set the amount of frequency deviation which the control voltage will effect. In this manner, a limit is set for the range of frequencies (bandwidth) within which the power supply will operate. Variable resistor 314 is used to adjust the center frequency.

The output from the voltage controlled oscillator 312, operating at four times the fundamental frequency, is sent to a D-type flip/flop 330 connected to form a divide by two circuit. The frequency signal $4f_p$ from the oscillator is thus divided by a factor of two to yield two signals, namely $2f_p$ conductor 302, and its complementary, 180 degrees shifted, signal $\overline{2f_p}$, conductor 304.

Two additional D-type flip/flop circuits 332 and 334 are used to generate reference signals. Flip/flop 332 again is connected as a divide by two circuit, the signal $2f_p$ being connected to its input. The outputs from this flip/flop 332 are the fundamental frequency signal $f_p$ apparent at conductor 306 and conductor 310 and the complementary signal $\overline{f_p}$. These latter signals are 180 degrees out of phase with one another. The signal $\overline{2f_p}$ acts as a clocking signal for the flip/flop 334 and the signal $\overline{f_p}$ acts as the data input. The result is that flip/flop 334 produces an output signal $f'_p$ conductor 308, which signal is the fundamental frequency, but shifted by ninety degrees. The signals in digital form along conductors 308 and 310 are coupled to the demodulator 800 as previously described, whereas the signals of conductors 302, 304 and 306 are coupled to the modulator and driver circuit 400.

Figure 8:
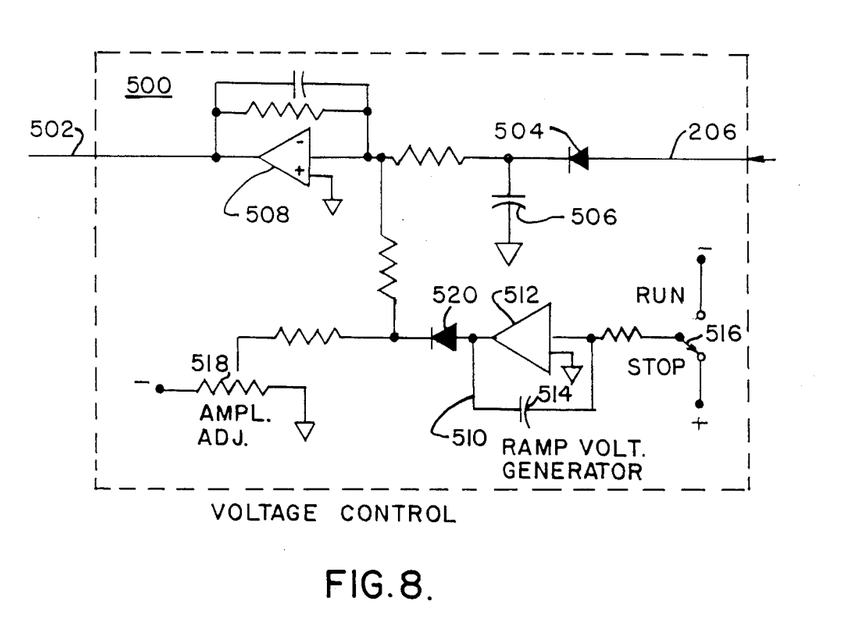
FIG. 8 is a schematic electrical circuit diagram of the voltage control circuit.

The voltage (amplitude) control circuit is shown in FIG. 8. A parameter of prime importance to an application of this type of ultrasonic apparatus is the amplitude of mechanical vibration provided by the transducer and horn. As described above, a motional amplitude responsive signal, conductor 206, FIG. 3, is derived in the output network, which signal is proportional to the driving voltage applied to the transducer. This voltage is known also as "motional voltage". The motional voltage is scaled and rectified. It is then summed with a reference voltage to produce an error signal. The error signal is amplified and fed to a combiner and to the modulator and driver circuit input. This feedback loop has the purpose of maintaining a desired motional amplitude setting. Because the motional voltage is sensed, the circuit arrangement is such as to maintain a set amplitude irrespective of line voltage variations and of loading effects reflected on the power supply.

Provisions are made to vary the reference voltage either internal or external to the power supply. In this manner, the amplitude of vibration may be set by a control potentiometer or by an external signal, such as a process derived signal. The system has a fast response time so that an amplitude variation can be effected even during a particular weld cycle. During the start-up period, the reference voltage signal is modified by a ramp function generator. The result is that the motional voltage and the resultant amplitude of vibration starts from a rest condition and increases at a set linear rate until the preset point of regulation is reached. Therefore, the transducer is caused to increase its amplitude of vibration in an orderly manner at a linear rate, rather than in a stepwise fashion.

The motional voltage signal, conductor 206, is rectified by rectifier 504 and filtered by capacitor 506. The resultant direct current signal is sent to an integrating amplifier 508. At the amplifier 508, the direct current signal responsive to the driving voltage applied to the transducer 18 is compared with a reference voltage setting. The reference voltage value may be a set point signal from an amplitude adjusting potentiometer 518, or a variable signal, such as a ramp signal originating at the ramp voltage generator 510 comprising an amplifier 512 and capacitor 514 in conjunction with a voltage source and series connected switch 516 having a "STOP" position and a "RUN" position.

If the amplitude responsive signal is lower than the reference voltage, the output signal from the amplifier 508 will increase the signal level to the combiner 20 and to the modulator and driver circuit 400 for causing the output voltage provided by the converter to increase. If the amplitude responsive signal is greater than the reference voltage, the output from the amplifier 508 will decrease and cause the motional voltage applied to the transducer to decrease.

For starting the power supply from rest, the ramp generator 510 is used to modify the reference voltage from potentiometer 518. At rest, switch 516 is in the "STOP" setting as shown. The ramp generator clamps the reference voltage to a zero value. When the switch is moved to the "RUN" position, the ramp generator output slowly rises at a linear rate and allows the reference voltage to rise also. This occurs until the clamp diode 520 is no longer conductive, at which condition the power supply is running at a steady state condition. It will be understood, of course, that the switch 516 will be an electronic switch.

Figure 9:
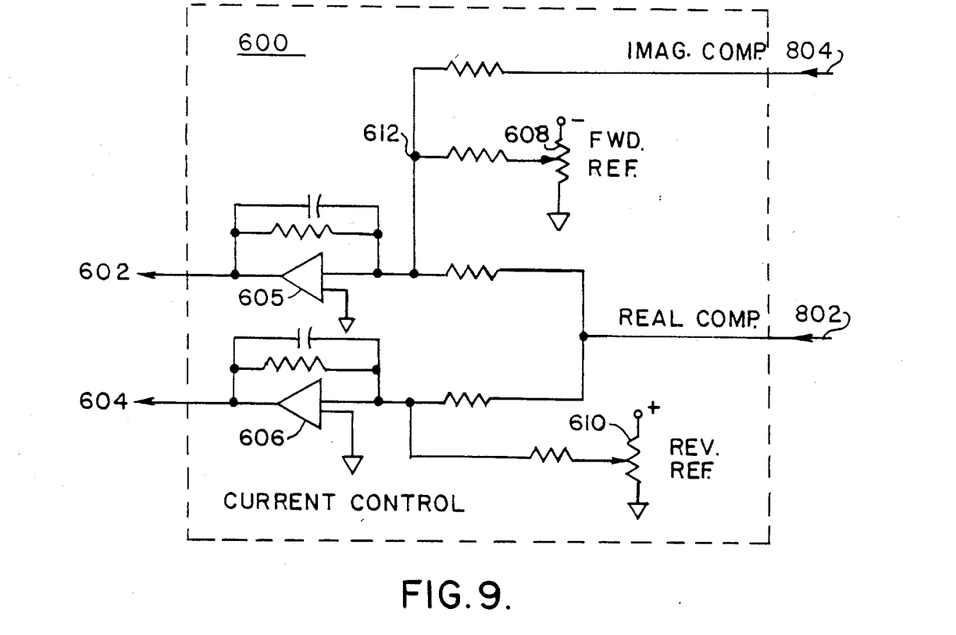
FIG. 9 is a schematic electrical circuit diagram of the current control circuit.

FIG. 9 is a circuit diagram of the current control circuit 600. The current control circuit components regulate and limit the normal output current levels produced by the power supply. During a normal sequence of power supply operation, there exist various conditions in which these circuit components come into operation.

During the operate or run time, the power supply may be required to deliver more power than it can safely provide. The operating current level is sensed at the output network 200, processed by the current filter 700 and by the real current component circuit of the demodulator 800. The resultant signal is compared in the current control circuit 600 with a reference signal defining maximum current. Any resulting difference or error signal corresponding to excessive current is used to control the modulator and driver circuit 400 after having passed through the combiner 20. The action is to reduce the alternating current voltage amplitude output from the converter 100 and, hence reduce and adjust the current to its preset maximum value. This control is linear in its characteristic.

The transducer 18, moreover, is a mechanically resonant device and will store energy. The device is bidirectional in that it will both use and generate energy, that is electrical current. In order to control the amplitude of vibration of the transducer at a fast rate, the power supply must be able to receive as well as generate a maximum current. The output from the real current component portion of the demodulator, conductor 802, will change its polarity and level corresponding to the amount of current and its direction to or from the transducer. The output from the current control circuit will control, via the combiner 20, the modulator and driver circuit 400 to either decrease or increase the effective alternating current voltage output from the converter 100 depending upon the direction of current flow to or from the transducer.

During the start-up cycle, large reactive current components may be present in the current path from the converter to the transducer. In this event, a sample of the imaginary or reactive component signal from the demodulator, conductor 804, is combined with the real component current signal. The result is a load line shaping or modification of the current level set point to better protect the switching devices from failure caused by excessive energy switching during periods of load transitions.

Also, during start-up, large mechanical horns may require excessive energy to reach a set amplitude of vibration. In this case, if the current requirements are too great for causing the transducer with horn to reach its set amplitude during an allotted time interval, the current control circuit will modify the start cycle time by automatically reducing the signal to the modulator and driver circuit 400. This feature will lengthen the start up time and keep the power supply from reaching an overload condition.

The real component of the current signal, conductor 802, from the demodulator 800 will have a value dependent on the current flow direction. Its polarity will be positive if the current flow is toward the transducer 18 and will be negative if the current flow is in the direction from the transducer. This real current component signal is sent to two integrating amplifiers 605 and 606 together with a respective reference signal. A signal corresponding to the maximum permissible forward current is generated by potentiometer 608 and the signal corresponding to the maximum permissible reverse current is generated by potentiometer 610.

If the actual forward current signal exceeds the reference forward signal value, the amplifier 605 will produce an output voltage signal to the combiner 20 and to the modulator and driver circuit, conductor 602, to decrease the output of the power supply by reducing the alternating current voltage from the converter. This condition will either limit the rate of rise of the current to the transducer or reduce the current to a predetermined safe level.

If, however, the reverse current signal exceeds the reference reverse signal value, the amplifier 606 will produce an output voltage signal to the modulator, conductor 604, for causing an increase of current flow from the power supply, i.e. raising the alternating current voltage from the converter. This action will limit the rate of decrease of current flow from the transducer 18 to a safe level.

A portion of the imaginary or reactive current component received from the demodulator via conductor 804 is summed together with the real current component at junction 612. This summing action results in that the total amount of forward current during start up of the power supply is controlled if a mistuned condition prevails.

Figure 10:
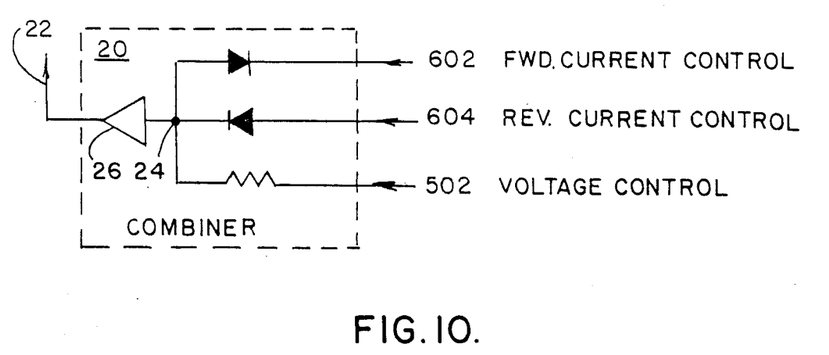
FIG. 10 is a schematic electrical circuit diagram of the combiner.

FIG. 10 depicts the combiner circuit which combines, at junction 24, the output signal from the voltage control circuit 502, the voltage control signal, with output signals from the current control circuit provided either by conductor 602 or conductor 604 to produce via buffer amplifier 26 a combined control signal at conductor 22 to the modulator and driver circuit 400. This control signal serves as a composite control signal to regulate the output voltage provided by the converter 100. If the transducer operates within predetermined levels of current flow, only the amplitude control signal 502 will be effective as output from the combiner 22. If the current flow to the transducer or from the transducer is above the desired level, the voltage control signal is modified by the current responsive signal as described.

Figure 11:
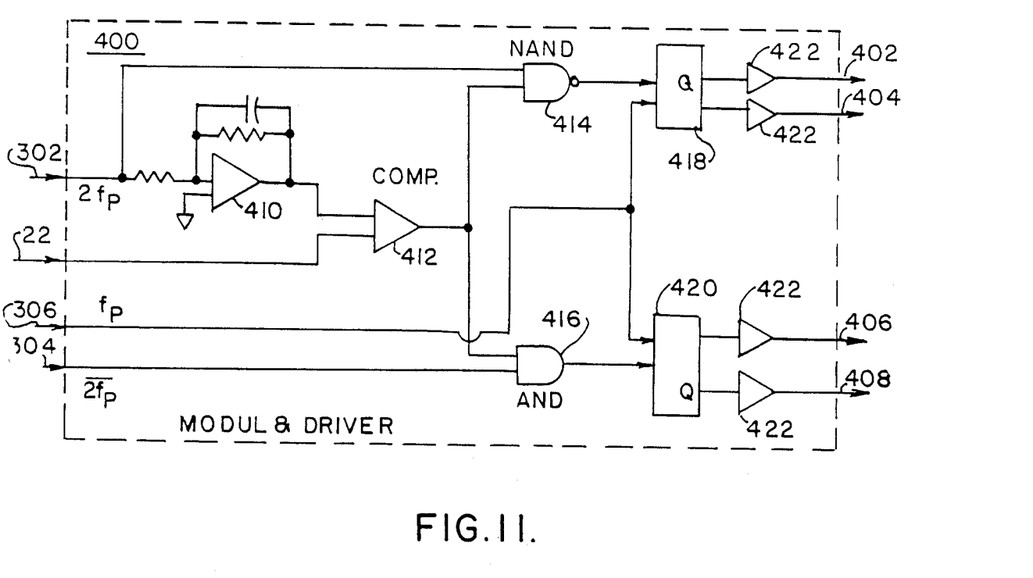
FIG. 11 is a schematic electrical circuit diagram of the modulator and driver circuit.

FIG. 11 is a schematic circuit diagram of the modulator and driver circuit which receives the frequency responsive signals from the voltage controlled oscillator and the combined voltage control signal from the voltage control circuit and the current control circuit. Therefore, the modulator and driver circuit 400 operates on a voltage control signal and the signals generated by the voltage controlled oscillator providing output signals for suitably controlling the operation of the direct current to alternating current converter 100.

The timing signal from the conductor 302 (double frequency signal $2f_p$) coming from the voltage controlled oscillator 300 is sent to an integrating amplifier circuit 410 which causes a triangular shaped output signal with equal slopes. This signal, in turn, is applied to a comparator circuit 412. The comparator circuit 412 also receives, via conductor 22, the steady state composite signal from the combiner 22, representing a voltage control signal. The comparator is used to compare the control voltage with the triangularly shaped signal. The output from the comparator 412 is fed to a NAND gate 414 and an AND gage 416. The NAND gate 414 also receives the timing signal $2f_p$ from conductor 302. The AND gate 416 receives as its second input signal the signal from conductor 304 representing the signal of double frequency of the imaginary current component $\overline{2f_p}$. The output from the NAND gate 414 and the output from the AND gate 416 are applied as inputs to a respective flip/flop circuit 418 and 420, each of which receives also a signal $f_p$ from conductor 306, representing a timing signal.

The output signals from flip/flop 418 and flip/flop 420 exhibit a variable phase relationship with each other, varying from a minimum of zero degrees, which will be minimum output voltage from the converter 100, to a maximum of 180 degrees, providing maximum output voltage. The buffer amplifiers 422 form driving stages. The respective 180 degrees shifted output signals appearing across conductors 402 and 404, and conductors 406 and 408 are coupled to the driving stage transformers 120 and 122 of the converter circuit, see FIG. 2. Therefore, the converter 100 is caused to provide by pulse modulation a feedback controlled alternating current output voltage, accurately controlled in respect to frequency, amplitude of motional voltage and maximum current flow. Hence, the power supply has all the desired attributes set forth at the beginning of the specification.

While there has been described and illustrated a preferred embodiment of the invention, it will be apparent to those skilled in the art that various changes and modifications may be made therein without departing from the broad principle of this invention, which shall be limited only by the scope of the appended claims.

What is claimed is:

1. A power supply for operating a piezoelectric transducer comprising:
    a direct current supply;
    a clamped-mode resonant converter coupled for receiving direct current from said direct current supply and providing an alternating current output for operating a piezoelectric transducer at its parallel resonant frequency;
    an output network coupled to said converter for receiving the alternating current output from said converter and providing an alternating current output of suitable magnitude for operating the piezoelectric transducer at said resonant frequency, and including means for providing a first alternating current signal commensurate with the current flowing between said output network and the transducer;
    a current filter coupled to said network for receiving said first alternating current signal and providing a second signal commensurate with the amplitude and phase of the fundamental frequency of the current flowing between said converter and the transducer;
    a demodulator coupled for receiving said second signal and receiving also a digital signal commensurate with the fundamental frequency of the current flowing between said converter and transducer but phase shifted by ninety degrees, and providing a third signal commensurate with the value of the imaginary current component of the fundamental frequency of the current flowing between said converter and the transducer;
    a loop filter coupled to said modulator for receiving said third signal and including means for producing a fourth signal having a direct current amplitude commensurate with the amplitude of said imaginary current component;
    a voltage controlled oscillator adapted to operate at a predetermined frequency coupled for receiving said fourth signal as a control signal for causing said oscillator to change its frequency commensurate with the amplitude of said fourth signal, providing said digital signal to said demodulator, and providing further output signals responsive to the operating frequency of said oscillator, and
    a modulator and driver circuit coupled for receiving said further output signals from said oscillator and providing control signals to said converter for causing said converter to produce said alternating current output at a frequency which causes the transducer to operate at its parallel resonant frequency.

2. A power supply for operating a piezoelectric transducer as set forth in claim 1, said means for providing said first alternating current signal comprising a current transformer coupled in circuit with the flow of current between said converter and the transducer.

3. A power supply for operating a piezoelectric transducer as set forth in claim 2, said current filter being a band pass filter including a pair of stagger tuned parallel resonant circuits for attentuating frequencies outside a predetermined pass range of the fundamental parallel resonant frequency of the transducer and for passing said fundamental resonant frequency signal substantially without phase shift.

4. A power supply for operating a piezoelectric transducer as set forth in claim 2, said current filter including a pair of stagger tuned parallel resonant circuits coupled for receiving said first signal, said resonant circuits having equal and opposite phase slopes for attenuating frequencies outside a predetermined pass range of the fundamental parallel resonant frequency of the transducer, and a summing circuit coupled for summing the signals from said stagger tuned parallel resonant circuits for providing said second signal.

5. A power supply for operating a piezoelectric transducer as set forth in claim 2, said demodulator including analog switch means coupled for receiving said second signal and said digital signal and providing at its output said third signal.

6. A power supply for operating a piezoelectric transducer as set forth in claim 5, said means for producing said fourth signal in said loop filter comprising an integrating circuit receiving at its input said third signal and providing at its output said fourth signal.

7. A power supply for operating a piezoelectric transducer as set forth in claim 1, said voltage controlled oscillator including a timer circuit operating substantially at a multiple of the fundamental frequency of the current flowing between said converter and transducer.

8. A power supply for operating a piezoelectric transducer as set forth in claim 7, said timer circuit operating substantially at four times the frequency of said current and including flip/flop circuits coupled to the output signal from said timer circuit for obtaining said further output signals having respectively a frequency equal to the parallel resonant frequency and a frequency twice the parallel resonant frequency.

9. A power supply for operating a piezoelectric transducer as set forth in claim 8, said modulator and driver circuit including a set of gate circuits for receiving said further output signals and including a set of flip/flop circuits coupled to said gate circuits for providing said control signals responsive to said output signals from said oscillator, said control signals to said converter comprising a set of phase shifted signals for operating said converter.

10. A power supply for operating a piezoelectric transducer as set forth in claim 1, and including means coupled to said output network for providing a signal commensurate with the motional voltage applied to the transducer, a voltage control circuit coupled for receiving said signal commensurate with the motional voltage and comparing it with a preset voltage signal to produce a motion amplitude control signal which is supplied to said modulator and driver circuit for causing said control signals to said converter to be responsive to said motion amplitude control signal for causing said converter to produce said alternating current output with a voltage whose amplitude is responsive to said motion amplitude control signal.

11. A power supply for operating a piezoelectric transducer as set forth in claim 10, said preset voltage signal being adjustable.

12. A power supply for operating a piezoelectric transducer as set forth in claim 11, said voltage control circuit including also a ramp voltage generator for providing a ramp voltage signal responsive to the power supply being started from a non-operating condition, circuit means coupled for causing said ramp signal to modify said preset voltage signal to produce said motion amplitude control signal which causes the voltage of said alternating current output to increase in a ramp like manner whereby to cause the amplitude of vibration of the transducer to increase also in a ramp like manner.

13. A power supply for operating a piezoelectric transducer as set forth in claim 12, said ramp voltage generator being coupled in series with a switch, and the output signal from said ramp generator, said preset voltage signal and said signal commensurate with the motional voltage being coupled to the input of an integrating amplifier which provides at its output said motion amplitude control signal.

14. A power supply for operating a piezoelectric transducer comprising:
 a direct current supply;
 a clamped-mode resonant converter coupled for receiving direct current from said supply and providing an alternating current output for operating a piezoelectric transducer at its parallel resonant frequency;
 an output network coupled to said converter for receiving the alternating current output from said converter and providing said alternating current output to the transducer for causing operation of the transducer at its parallel resonant frequency, said network including means for providing a first signal commensurate with the current flowing between said network and the transducer and a second signal commensurate with the motional voltage applied to the transducer;
 a current filter coupled for receiving said first signal and providing a third signal commensurate with the amplitude and phase of the fundamental frequency of the current flowing between said converter and transducer;
 a demodulator coupled for receiving said third signal and receiving respectively also a digital signal commensurate with the fundamental frequency but phase shifted by ninety degrees and an in-phase digital signal commensurate with the fundamental frquency, and providing a fourth signal commensurate with the value of the imaginary current component of the fundamental frequency of the current flowing between said converter and the transducer and providing a fifth signal commensurate with the value of the real current component of said current;
 a loop filter coupled for receiving said fourth signal and including means for producing a sixth signal having a direct current amplitude commensurate with the amplitude of said imaginary current component;
 a voltage controlled oscillator adapted to operate at a predetermined frequency coupled for receiving said sixth signal as a frequency feedback signal for causing said oscillator to change its frequency commensurate with the amplitude of said sixth signal, providing said digital signals to said demodulator, and providing further output signals responsive to the operating frequency of said oscillator;
 a voltage control circuit coupled for receiving said second signal and including means for combining said second signal with an adjustable reference voltage and providing in response thereto a motion amplitude control signal;
 a current control circuit coupled for receiving said fourth signal and said fifth signal from said demodulator circuit and including means for providing a reference signal responsive to the maximum allowable forward current flowing to the transducer and a reference signal responsive to the maximum allowable reverse current flowing from the transducer and providing an output signal responsive to the condition of a current flowing greater than the maximum allowable forward current and a current flowing greater than the maximum allowable reverse current;
 a combiner coupled for receiving said motion amplitude control signal from said voltage control circuit and said output signal from said current control circuit and providing a combined motion amplitude control signal, and
 a modulator and driver circuit coupled for receiving said further output signals from said voltage controlled oscillator and said combined motion amplitude control signal from said combiner and producing in response thereto control signals to said converter for causing said converter to produce said alternating current output at a frequency responsive to said further output signals and with a voltage amplitude responsive to said combined motion amplitude control signal.

15. A power supply for operating a piezoelectric transducer as set forth in claim 14, said voltage control circuit including a ramp voltage generator for providing a ramp voltage signal for briefly modifying said adjustable reference voltage when the power supply is changed from its nonoperating condition to its operating condition.

16. A power supply for operating a piezoelectric transducer as set forth in claim 15, said ramp generator coupled in circuit with a switch and being effective for providing said ramp voltage responsive to a signal from said switch.

17. A power supply for operating a piezoelectric transducer as set forth in claim 14, said control signals to said converter provided by said modulator and driver circuit comprising a set of output signals phase shifted with respect to one another for controlling said converter.

18. A power supply for operating a piezoelectric transducer as set forth in claim 14, said means of said current control circuit for providing said maximum allowable current reference signals comprising respective potentiometers.

19. A power supply for operating a piezoelectric transducer as set forth in claim 18, said means of said current control circuit including further a pair of integrating amplifier circuits, one of the respective input terminals of the amplifier circuits being coupled together and receiving said fifth signal, one of the amplifier circuits receiving also said fourth signal and said reference signal responsive to maximum allowable forward current, the other amplifier circuit receiving said reference signal responsive to maximum allowable reverse current, causing said amplifier circuits to provide said signal commensurate with either a current greater than the maximum allowable forward current or a current greater than the maximum allowable reverse current.

20. A power supply for operating a piezoelectric transducer as set forth in claim 19, said modulator and driver circuit being arranged to cause a signal commensurate with a current greater than the maximum permissible forward current to reduce the voltage of the alternating current output provided by said converter, and to cause a signal commensurate with a current greater than the maximum permissible reverse current to increase the voltage of the alternating current output provided by said converter.

21. A power supply for operating a piezoelectric transducer comprising:
   a direct current supply;
   a clamped-mode resonant converter coupled for receiving direct current from said supply and providing an alternating current output for operating a piezoelectric transducer at its parallel resonant frequency;
   an output network coupled to said converter for receiving the alternating current output and for coupling said output to the transducer;
   a modulator and driver circuit coupled to said converter for providing control signals to said converter for causing the frequency and voltage of the alternating current output from said converter to be responsive to said control signals;
   a phase locked loop circuit coupled between said network and said modulator and driver circuit for receiving from said network a signal responsive to the current flowing between said network and transducer and providing in response thereto to said modulator and driver circuit signals for causing said control signals to said converter to effect operation of said converter and generating the alternating current output at a frequency substantially coincident with the parallel resonant frequency of the transducer;
   a voltage control circuit coupled to said network for receiving a voltage signal responsive to the motional voltage applied to the transducer and including means for comparing said voltage signal with a reference signal and providing in response thereto a voltage control signal;
   a current control circuit coupled to said network for receiving a current amplitude responsive signal of the current flowing between said network and the transducer and including means for comparing said current amplitude responsive signal with reference signals commensurate with maximum permissible current flow between said converter and the transducer and producing in response thereto a current control signal indicative of said current amplitude responsive signal exceeding said maximum permissible current flow, and
   a combiner circuit coupled for receiving said current control signal and said voltage control signal and in response thereto providing a combined voltage control signal to said modulator and driver circuit for causing said control signals provided to said converter to effect that the voltage amplitude of the alternating current output from said converter is responsive to said combined voltage control signal.

22. A power supply for operating a piezoelectric transducer as set forth in claim 21, said reference signals of said current control signal being commensurate respectively with maximum permissible current flow from said converter to the transducer and maximum permissible current flow from the transducer to said converter.

23. A power supply for operating a piezoelectric transducer as set forth in claim 22, said combined voltage control signal to said modulator and driver circuit causing the voltage amplitude of the alternating current output from said converter to decrease when the current control signal is responsive to a greater than maximum permissible current flow from said converter to the transducer, and for causing the voltage amplitude of the alternating current output from said converter to increase when the current control signal is responsive to a greater than maximum permissible current flow from the transducer to said converter.

24. A power supply for operating a piezoelectric transducer as set forth in claim 21, said voltage control circuit including a ramp voltage generating circuit for causing responsive to a switching signal said voltage control signal to increase in a ramp like manner whereby to cause the amplitude of the voltage of said alternating current output from said converter to increase also in a ramp like manner.

25. A power supply for operating a piezoelectric transducer as set forth in claim 21, said converter providing an alternating current output for causing the transducer to operate at a predetermined parallel resonant frequency in the range between 18 kHz and 60 kHz.

* * * * *

UNITED STATES PATENT AND TRADEMARK OFFICE
CERTIFICATE OF CORRECTION

PATENT NO. : 4,973,876
DATED : November 27, 1990
INVENTOR(S) : Allan J. Roberts

It is certified that error appears in the above—identified patent and that said Letters Patent is hereby corrected as shown below:

Column 4, line 21, replace "altenating" with ---alternating---

Signed and Sealed this

Eleventh Day of August, 1992

Attest:

DOUGLAS B. COMER

*Attesting Officer*     *Acting Commissioner of Patents and Trademarks*